Dec. 20, 1955 J. KURSHAN 2,728,034

SEMI-CONDUCTOR DEVICES WITH OPPOSITE CONDUCTIVITY ZONES

Filed Sept. 8, 1950

INVENTOR
Jerome Kurshan
BY H. L. Newston
ATTORNEY

United States Patent Office 2,728,034

Patented Dec. 20, 1955

2,728,034

SEMI-CONDUCTOR DEVICES WITH OPPOSITE CONDUCTIVITY ZONES

Jerome Kurshan, Princeton, N. J., assignor to Radio Corporation of America, a corporation of Delaware Application September 8, 1950, Serial No. 183,817

9 Claims. (Cl. 317—235)

This invention relates generally to semi-conductor devices suitable for use in signal translating systems such, for example, as amplifier, oscillator, modulator or the like circuits, and more particularly relates to a semi-conductor device and to electrical circuits embodying such a device which consists of a body of semi-conducting material having a plurality of zones of different conductivity types.

Semi-conductor devices suitable for use in signal translating systems such, for example, as amplifier, oscillator or modulator circuits are well known. Such devices may include a semi-conducting body and an emitter electrode, a collector electrode and a base electrode in contact with the body. Devices of this type are generally called transistors. The emitter and collector electrodes may be point contacts or line contacts and ordinarily are in rectifying contact with the semi-conducting body. The base electrode, on the other hand, is in low-resistance contact with the body which may consist of a crystal of silicon or other semi-conducting material and preferably of germanium which is usually of the N type although it is feasible to utilize a crystal of the P type.

In order to obtain transistor action, the emitter is usually biased in the forward direction with respect to the semi-conducting body while the collector is biased in the reverse direction with respect to this body. If the semi-conducting body is of the N type, the emitter is made positive with respect to the base and the collector negative with respect to the base. If the crystal is of the P type, the potentials must be reversed. A transistor of this type has been disclosed, for example, in the U. S. patent to Barney, 2,486,776 granted on November 1, 1949.

Recently a semi-conductor amplifier has been suggested including a semi-conducting body which has separate P type and N type zones. Such a semi-conductor amplifier has been disclosed in the patent to Shockley 2,502,488 granted on April 4, 1950. The semi-conducting body has an electrical barrier or barrier layer which separates the P type and N type zones from each other. The emitter electrode consists of a point contact positioned closely adjacent to the barrier. Both the base and the collector electrodes are large-area electrodes which are in low-resistance contact with the N type and with the P type zones respectively of the crystal. It should be noted that the semi-conducting body consists of only two conductivity zones which, furthermore, are physically of opposite conductivity type.

As explained hereinbefore, a conventional transistor is usually provided with two point electrodes which serve respectively as emitter and collector. The provision of such point electrodes causes mechanical as well as electrical instability. Furthermore, there is reason to believe that the high noise level of a conventional semi-conductor amplifier is due at least in part to the presence of these point contacts.

It is, accordingly, an object of the present invention to provide an improved semi-conductor device suitable for use in signal translating systems, which requires but a single point contact or even none at all and, therefore, has improved stability.

Another object of the invention is to provide a semi-conductor device having a semi-conducting body with several zones of different or opposite conductivity types which has a high current gain as well as a good power gain.

A further object of the invention is to provide an improved semi-conductor device having means including a narrow zone of a conductivity type opposite to that of the adjacent zones of the semi-conducting body for controlling or varying the flow of an electrical current between a pair of electrodes.

A still further object of the invention is to provide a semi-conductor device having two zones of the same conductivity type separated by a high resistance barrier due to surface conditions at the interface or contacting area of the two zones.

A semi-conductor device, in accordance with the present invention comprises a body of semi-conducting material having two zones of the same conductivity type separated by a relatively narrow zone of the opposite conductivity type. Thus the semi-conductor device may, for example, consist of a crystal of germanium having two N type zones separated by a narrow P type zone which acts in the manner of an electrical barrier. The opposite conductivity types, such as P type and N type zones, of a semi-conducting crystal may readily be distinguished from each other, as is well known. Thus, the crystal may be utilized as a rectifier if the zone area is sufficiently large in which case it is provided with a low-resistance contact and with a rectifying contact or point electrode. If the crystal is of the N type and if the point contact is made negative with respect to the crystal, a comparatively low current will flow through the crystal. In that case, the crystal is biased in the reverse direction. Under the same bias conditions, if the crystal should be of the P type, a comparatively large current will flow through the crystal. In other words, the crystal is now biased in the forward direction. If the point contact is made positive with respect to the crystal, a comparatively large current will flow through an N type crystal while a comparatively small current will flow through a P type crystal. In other words, the N type crystal is now biased in the forward direction while the P type crystal is biased in the reverse direction.

The exact location and character of a P type zone which separates two N type zones may also be readily determined by electrical measurements. This has been described in a paper entitled "Electrical Properties of Crystal Grain Boundaries in Germanium" by G. L. Pearson, which appears in Bull. Am. Phys. Soc., vol. 24, page 12, June 16, 1949. Thus a fine spot of light moving across the surface of a crystal having leads soldered to opposite edges will develop on an oscilloscope, the trace of a pulse having a positive kick followed by a negative kick, thereby indicating the presence of an N–P–N junction. The existence of an electrical barrier may also be shown in general by passing a current through the semi-conducting material and probing the surface of the material. In that case, the potential drop is largely concentrated at the electrical barrier.

It should be borne in mind that for the purposes of this invention it makes no difference whether the intermediate layer or barrier of opposite conductivity type is actually a region where material of the opposite conductivity type is present or whether the intermediate layer exhibits such an electrical behavior because of some surface phenomena such as the surface states discussed by J. Bardeen, Phy. Rev., vol. 71, pages 717 to 727 (May 15, 1947).

Let it be assumed that the semi-conducting body has two N type zones separated by a P type zone or barrier.

In accordance with the present invention, an electrode is in low-resistance contact with each of the N type zones and a further electrode which may, for example, consist of a point electrode or of a plated strip of metal is in contact with one of the N type zones and positioned closely adjacent to the P type zone. One of the low-resistance electrodes functions in the manner of a base electrode while the other low-resistance electrode may be the collector electrode. The third electrode which may be in rectifying contact with the crystal, functions in the manner of an emitter electrode. Preferably emitter and base are in contact with the same N type zone. In that case, the collector should be biased negatively with respect to the base and the emitter should be biased positively with respect to the base. Consequently, electrons will flow between collector and base, and the magnitude of this current is limited by the N–P–N barrier which in turn is modified by the voltage applied to the emitter, thus controlling the collector current. The emitter will inject holes into the crystal, that is, charge carriers which carry a positive charge but which otherwise behave similar to electrons. It is believed that the holes are caused by the lack of an electron in an atom of the crystalline lattice and this electron deficiency will migrate under the influence of an externally applied electrical field.

The device of the invention may, for example, be utilized as an amplifier in which case the input signal may be impressed between emitter and base and the output signal may be derived between collector and base.

The novel features that are considered characteristic of this invention are set forth with particularity in the appended claims. The invention itself, however, both as to its organization and method of operation, as well as additional objects and advantages thereof, will best be understood from the following description when read in conjunction with the accompanying drawing, in which:

Figure 1:
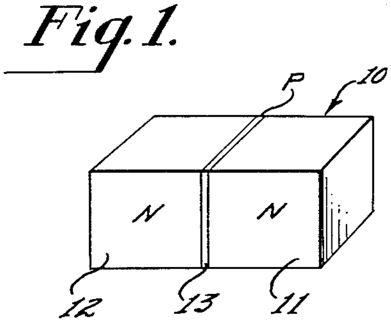
Figure 1 is a perspective view of a semi-conducting body utilized in the device of the present invention.

Referring now to the drawing, in which like components have been designated by the same reference numerals throughout the figures, there is illustrated in Figure 1 a semi-conducting body 10 which may consist of silicon or preferably of germanium. Composite body 10 consists, as shown, of two zones 11 and 12 of N type material. As indicated in Figure 1, zones 11 and 12 of N type material are separated by a relatively narrow zone 13 of P type conductivity. P type zone 13 preferably has a width of approximately 0.5 mil, but its width may vary between 0.05 and 5 mils.

A crystal, such as body 10 having two N type zones 11 and 12 and a P type zone 13 may occur naturally for example when the P type zone is a natural grain boundary. However, it is also feasible to obtain a body 10 as shown by neutron bombardment as disclosed by K. Lark-Horowitz and collaborators in Phys. Rev., vol. 74, 1948, page 1255. From this publication it is known that bombardment with neutrons will change an N type crystal to a P type crystal. Consequently, the structure of Figure 1 may be obtained by covering N type zones 11 and 12 with a neutron absorbing material such as a sheet of cadmium and irradiating the crystals with neutrons. Furthermore, an N type crystal may be changed to a P type crystal by suitable heat treatment, for example, by first heating the crystal and then quenching it. Finally, as will be explained in more detail hereinafter in connection with Figures 5 and 6, it is feasible to put the flat faces of two N type crystals together under light pressure in which case a high-resistance barrier will exist which functions as a P type zone. The existence of such a barrier has been disclosed in the paper by S. Benzer, Jour. Appl. Phys., vol. 20, page 814 (1948).

Figure 2:
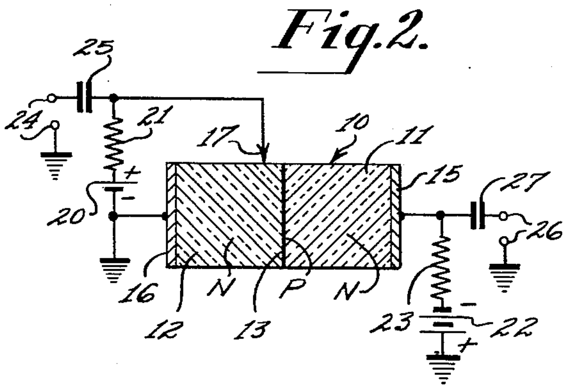
Figure 2 is a schematic sectional view and circuit diagram of a semi-conductor device embodying the present invention and connected in an amplifier circuit.

In accordance with the present invention a body, such as illustrated at 10 in Figure 1, may be utilized in a signal translating system as shown in Figure 2. The device of Figure 2 consists of body 10 provided with an electrode 15 in low-resistance contact with N type zone 11 and with an electrode 16 in low-resistance contact with N type zone 12. Electrode 15 may be considered the collector electrode, and electrode 16 may be considered the base electrode. Electrodes 15 and 16 may consist of suitable pieces of metal soldered to body 10 or they may be metal plated strips provided they are in low-resistance contact with the body.

A further electrode 17, which functions as the emitter electrode is in contact with N type zone 12 and is positioned closely adjacent to P type zone 13. As illustrated in Figure 2 emitter electrode 17 may, for example, be a point electrode consisting of a metallic wire having a fine point in contact with the crystal. Its distance from P type zone 13 may be between 0.5 and 10 mils. The relative dimensions of body 10 and its zones 11 and 12 are immaterial. Furthermore, the actual location of base electrode 16 and collector electrode 15 is of no importance to the operation of the device of the invention. It is also to be understood that emitter 17 need not be a rectifying electrode.

In accordance with the present invention a comparatively small bias voltage in the forward direction is impressed between emitter 17 and base 16. A bias voltage in the forward direction applied to a rectifying contact is also the low-resistance direction of the current flow. When non-rectifying contacts are used, a bias voltage in the forward direction may be defined as the polarity for which anomalous carriers are introduced, that is, which introduces holes into an N type crystal or electrons into a P type crystal. Generally, when the emitter is biased in the forward direction, it should be positive with respect to an N type crystal and negative with respect to a P type crystal. To this end there may be provided a suitable source of voltage such as battery 20 having its negative terminal connected to base 16, while its positive terminal is connected to emitter 17 through an impedance element such as resistor 21. Base 16 may be grounded as shown. Furthermore, a comparatively large bias voltage in the reverse direction is impressed between collector 15 and base 16. A bias voltage in the reverse direction between collector 15 and base 16 may be defined as follows: The collector 15 should be negative with respect to base 16 for an N type crystal and should be positive with respect to base 16 for a P type crystal. To this end there is provided a suitable source of voltage such as battery 22 having its positive terminal grounded, that is, connected to base 16, while its negative terminal is connected by a load impedance element such as resistor 23 to collector 15. An input signal may be impressed on input terminals 24, one of which is grounded while the other one is coupled through coupling capacitor 25 to emitter 17. An amplified output signal may be developed across load resistor 23 and may be obtained from output terminals 26, one of which is grounded while the other one is coupled through coupling capacitor 27 to collector 15.

The amplifier of Figure 2 is believed to operate in the following manner: a current consisting of a stream of electrons flows between base 16 and collector 15 under the influence of the electrical field developed by battery 22. The electrical current will normally be comparatively small because of the barrier that exists in zone 13. This flow of current is controlled by the voltage applied to emitter 17 which controls the magnitude or the height of the electrical barrier represented by P type zone 13.

Figure 3:
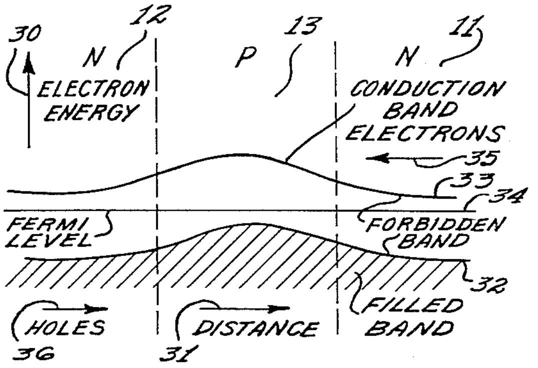
Figure 3 is a graph illustrating the electron energy as a function of distance in a portion of the device of Figure 2 in the equilibrium condition before bias voltages are applied and which will be referred to in explaining the operation of the device of the invention.

This operation can be explained more in detail by reference to Figure 3, which indicates the electron energy shown by arrow 30 with respect to distance indicated by arrow 31 in the electrical equilibrium condition, that is, without applied potentials. In Figure 3, N type zones 11 and 12 as well as P type zone 13 are shown on greatly enlarged scale. Below curve 32 is the filled band. Above curve 33 is the conduction band, while the forbidden band is between curves 32 and 33. Line 34 indicates the Fermi level. The Fermi level may be defined as the energy level having a probability of 50% of being occupied. When N type zone 11 is made negative with respect to N type zone 12 (as shown in Figure 2) the electrons will move from right to left in the conduction band as indicated by arrow 35. The holes will move from left to right in the filled band as shown by arrow 36. At the same time the energy levels shown in Figure 3 will be shifted, but the barrier will remain qualitatively the same.

When the device is operated as shown in Figure 2, the holes flowing from N type zone 12 through P type zone 13 into N type zone 11 will be slowed down under the hump of curve 32. This will also lower not only the hump of curve 32 but also the hump of curve 33 thereby increasing the flow of electrons from right to left of Figure 3. In other words, the number of holes injected by emitter 17 into zone 12 controls the magnitude of the electron flow between base 16 and collector 15. The number of holes injected into zone 12, of course, depends on the voltage applied to emitter 17. It is to be understood that at the present time the theory of operation given herein is tentative only.

Short-circuit current gains of the device of Figure 2 as high as 3 have been measured. Even larger current gains are theoretically possible because the holes are trapped or slowed down by the hump of curve 32. Power gains as large as 20 db have been obtained at the present time with the device of Figure 2. The emitter voltage may be between approximately 0.1 and 1 volt, while the collector voltage may be between approximately —1 and —45 volts with respect to base 16. In view of the fact that the device of Figure 2 requires but a single point electrode 17, it is mechanically as well as electrically more stable than conventional transistors.

It is to be understood that the conductivity types of zones 11, 12, and 13 may be reversed. In other words, zones 11 and 12 may be of the P type while zone 13 may be of the N type. In that case, the polarity of the voltages applied to emitter 17 and collector 15 should be reversed.

Figure 4:
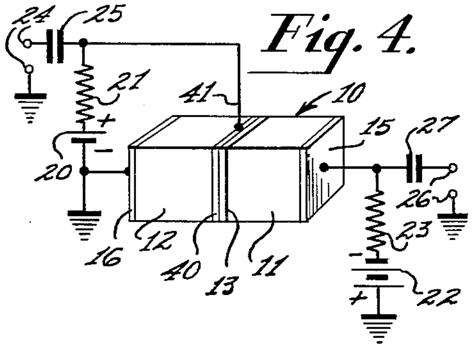
Figure 4 is a schematic view in perspective and circuit diagram of a modified semi-conductor amplifier in accordance with the invention.

Referring now to Figure 4 there is illustrated a modified semi-conductor device in accordance with the invention. The device again consists of body 10 having N type zones 11 and 12 separated by a P type zone 13. Base 16 and collector 15 may take the same form as shown in Figure 2. However, the emitter electrode consists of a strip 40 of metal positioned closely adjacent to and substantially parallel with P type zone 13. Preferably metallic strip 40 is applied to and extends about the entire surface of N type zone 12. Metallic strip 40 may have a distance between approximately 0.5 and 10 mils from P type zone 13 and may have a width of between approximately 0.5 and 5 mils. Metallic strip 40 may be evaporated, plated, or painted on to the surface of body 10. A conductor such as shown at 41 may be connected to metallic strip 40 by soldering or by pressing a suitable lead such as a wire thereto. Emitter electrode 40 may accordingly be a large-area electrode and may also be non-rectifying. If N type zone 12 should be comparatively thin, it is feasible to exchange electrodes 16 and 40, that is, electrode 40 may be used as base electrode, while electrode 16 may serve as an emitter electrode.

Figure 5:
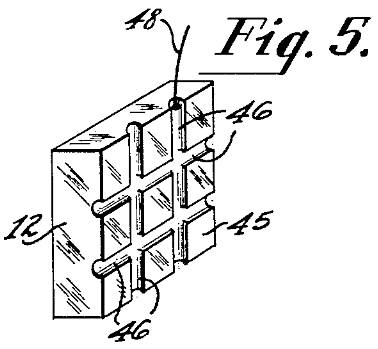
Figure 5 is a view in perspective of a semi-conducting crystal provided with an electrode in accordance with the invention.

As explained hereinbefore, it is also feasible to press the flat faces of two N type crystals together, in which case there will exist a narrow barrier zone between the two crystals. Such a crystal has been illustrated in Figure 5 to which reference is now made. The emitter electrode may in this case consist of an electrically conducting grid on the face of one of the N type crystals 12, as illustrated in Figure 5. The crystal is provided with a substantially flat face 45 provided with a plurality of intersecting grooves shown at 46. After the face of crystal 12 is provided with grooves 46, a metal may be evaporated onto the surface of the crystal until it fills at least partially grooves 46. Then the surface of crystal 12 may be ground until all the metal is removed from the surface which should then be flat. The metal illustrated at 47 in Figure 6 will fill at least partially grooves 46.

Figure 6:
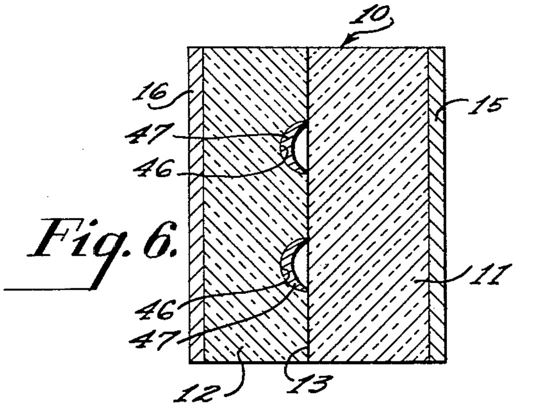
Figure 6 is a sectional view illustrating two N type crystals separated by a P type zone.

A second N type crystal 11 having a flat face is then put against the flat face of crystal 12, as shown in Figure 6. The two N type crystals 11 and 12 may then be provided with low-resistance electrodes 15 and 16. Contact may be made to the metal 47 in grooves 46 by a suitable lead indicated at 48 in Figure 5. A narrow P type zone 13 is formed between the two N type crystals 11 and 12 as indicated in Figure 6.

It is also feasible to cement the two crystals 11 and 12 together with a very thin layer of cement which should be so thin that either portions of the two crystals 11 and 12 contact each other or else that an artificial barrier layer penetrable by the electrical carriers is formed. The device of Figure 6 may be used as an amplifier in the circuit shown in Figures 2 and 4. It will further be understood that the device of the invention may also be used in oscillator, modulator or the like circuits.

There has thus been disclosed an improved semi-conductor device suitable for signal translating systems. The device includes a body of semi-conducting material having two zones of the same conductivity type and a further zone of opposite conductivity type separating the first two zones. The device has a high current gain, a comparatively high power gain and requires no rectifying electrodes.

What I claim is:

1. A semi-conductor device comprising a body of semi-conducting material having two zones of the same conductivity type separated by a further narrow zone of the opposite conductivity type, an electrode in low-resistance contact with each of said zones of the same conductivity type, and a further electrode consisting of a strip of metal extending about the surface of one of said zones of the same conductivity type and positioned closely adjacent to and substantially parallel with said further zone.

2. A semi-conductor device comprising a body of semi-conducting material having two zones of N type material separated by a relatively narrow zone of P type conductivity, an electrode in low-resistance contact with each of said N type zones, and a further electrode consisting of a strip of metal extending about a portion of the surface of one of said N type zones and applied closely adjacent to and substantially parallel with said P type zone.

3. A semi-conductor device comprising a first crystalline body of semi-conducting N type material having a substantially flat face, a plurality of intersecting grooves in said flat face, a metal provided in said grooves and forming an electrode for said first body, a second crystalline body of semi-conducting N type material having a substantially flat face, said flat faces contacting each other to provide a narrow barrier layer of P type conductivity, and a further electrode in low-resistance contact with each of said bodies and disposed remote from said faces.

4. A semi-conductor device comprising a first crystalline body of semi-conducting N type material having a substantially flat face, a second crystalline body of semi-conducting N type material having a substantially flat face, said flat faces contacting each other to provide a narrow barrier layer of P type conductivity, a base and a collector electrode, each being in low-resistance contact with one of said bodies and disposed remote from said faces, and an emitter electrode in contact with said first body and positioned relatively closely to said faces.

5. A semi-conductor device comprising a body of semi-conducting material having two zones of the same conductivity type separated by an intermediate zone of the opposite conductivity type, a first electrode in low resistance contact with one of said two zones, a second electrode in low resistance contact with the other of said two zones, and a further electrode in contact with one of said two zones and positioned closely adjacent to said intermediate zone.

6. The device defined in claim 5 wherein said further electrode is in rectifying contact with one of said two zones.

7. The device defined in claim 5 wherein said further electrode is in small-area rectifying contact with one of said two zones.

8. The device defined in claim 5 wherein said intermediate zone is electrically floating.

9. The device defined in claim 5 wherein said intermediate zone has a width in the range of 0.05 to 5 mils.

References Cited in the file of this patent

UNITED STATES PATENTS

| | | |
|---|---|---|
| 2,502,479 | Pearson | Apr. 4, 1950 |
| 2,502,488 | Shockley | Apr. 4, 1950 |
| 2,524,033 | Bardeen | Oct. 3, 1950 |
| 2,524,035 | Bardeen et al. | Oct. 3, 1950 |
| 2,569,347 | Shockley | Sept. 25, 1951 |
| 2,623,103 | Kircher | Dec. 23, 1952 |